United States Patent [19]

Nielsen et al.

[11] Patent Number: 4,679,215
[45] Date of Patent: Jul. 7, 1987

[54] EXCEEDANCE COUNTING INTEGRATING PHOTO-DIODE ARRAY

[75] Inventors: Max E. Nielsen, Littleton, Colo.; Joseph H. Labrum, West Jordan; Patrick S. Grant, Orem, both of Utah

[73] Assignee: Sperry Corporation, Blue Bell, Pa.

[21] Appl. No.: 805,930

[22] Filed: Dec. 6, 1985

[51] Int. Cl.⁴ .............................................. G11C 19/00
[52] U.S. Cl. .................................. 377/95; 358/213.29; 377/54
[58] Field of Search ..................... 377/95, 57, 58, 63, 377/53, 54, 55, 56; 307/320, 450, 311, 362; 358/213, 241

[56] References Cited

U.S. PATENT DOCUMENTS

| | | | |
|---|---|---|---|
| 3,577,012 | 5/1971 | Dummermuth | 377/95 |
| 3,869,212 | 3/1975 | Burcher et al. | 356/419 |
| 3,962,778 | 6/1976 | Palmer | 29/572 |
| 4,027,323 | 5/1977 | Lorenz et al. | 357/30 |
| 4,048,535 | 9/1977 | Cox et al. | 313/367 |
| 4,069,095 | 1/1978 | Lorenz et al. | 156/632 |
| 4,126,795 | 11/1978 | Moorey | 377/95 |
| 4,191,899 | 3/1980 | Tomczak | 307/320 |
| 4,196,508 | 4/1980 | Lorenz | 29/577 R |
| 4,200,812 | 4/1980 | Fichter | 377/95 |
| 4,309,106 | 1/1982 | Smith | 356/121 |
| 4,317,991 | 3/1982 | Stauffer | 250/201 |
| 4,425,501 | 1/1984 | Stauffer | 250/216 |
| 4,438,461 | 3/1984 | Sprague et al. | 358/302 |
| 4,563,601 | 1/1986 | Asano et al. | 307/443 |

OTHER PUBLICATIONS

"Common Threshold Index Compensation Type Amplifier Configuration for Diskettes", IBM Technical Disclosure Bulletin, vol. 20, No. 3, Aug. 1977, pp. 1148–1150, by S. G. Steele.

Primary Examiner—John S. Heyman
Assistant Examiner—K. Ohralik
Attorney, Agent, or Firm—G. Donald Weber, Jr.; Glenn W. Bowen

[57] ABSTRACT

The use of a comparator and counter associated, on-chip, with each photo-element of an array. Sensing each photo-element without discharging it and allowing each photo-element to accumulate a charge which is large relative to noise variations. These features result in a photo-detector with large signal-to-noise ratios.

8 Claims, 6 Drawing Figures

4,679,215

EXCEEDANCE COUNTING INTEGRATING PHOTO-DIODE ARRAY

GOVERNMENT RIGHTS

The U.S. Government has rights in this invention in accordance with contract No. F30602-84-C-0089 awarded by the Department of the Air Force.

BACKGROUND

1. Field of the Invention

This invention is directed to photo-detector structures, in general, and to a photo-detector array device including charge integrating photo-elements, in particular.

2. Prior Art

In typical photo-detector array architectures known in the art, the process of measuring the stored charge on a photo-element (typically, a reverse-biased PN junction) involves discharging the photo-element. In this instance, when the accumulated charge is small, the signal-to-noise ratio (SNR) of this measurement is poor. To reduce noise uncertainties to levels which permit dynamic ranges, i.e. maximum intensity versus minimum intensity, of more than $10^4$ to $10^5$ requires digital integration of many measurements and usually takes hours to accomplish.

A wide variety of photo-detector arrays exist on the market today. These include arrays of a number of individual, very closely spaced, photo-detectors fabricated on a single piece of silicon. This arrangement allows measurement of the intensity of a light beam as a function of displacement. In some cases, these arrays are used in acousto-optic spectrum analyzers wherein the displacement of the light beam along the linear dimension is proportional to the frequency of the light beam and the intensity is proportional to the signal strength at that frequency. Typically, this type of detector uses a charge-coupled device (CDD) detector array. In this arrangement, a number of reverse biased diodes, fabricated in a single chip, accumulate charge which has been generated by electron/hole pair generation when a photon strikes the material of the detector. The accumulated charge is loaded into a charge-coupled-device register and the charge packets, one for each diode, are transferred along the CCD to a charge sensing amplifier. (This type of device is often referred to as a "bucket brigade register".) The output voltage of the amplifier is proportional to the charge that has been dumped onto it. The charge is, in turn, proportional to the intensity of light which struck the photo-diode which produced the charge originally.

The principal drawback for many applications is that this type of detector is quite noisy. The noise is, typically, one part in ten thousand (or even as much as one part in a thousand) of the maximum signal, i.e. saturation level or intensity, that the detectors are capable of measuring. For many applications it is necessary to have less noise because the noise limits the smallest signal which can be reliably measured with the system. In a typical CCD detector array the noise is $10^{-3}$ of the maximum signal whereas in most applications it is desirable that noise be no more than $10^{-6}$ of the maximum signal. The smaller noise level allows measurement of intensities from a standardized unit of one to a million intensity units. One way that users of CCD detectors overcome this noise problem is to take many readings and then average these readings. This procedure reduces the uncertainties due to the noise so that measurements can be made accurately with very small intensities as well as with very large intensities. However, to take enough samples with a conventional CCD detector so as to reduce the noise by averaging takes a long time, e.g. on the order of an hour. This is unacceptably slow for many situations.

There is also known a non-integrating detector array which is capable of a dynamic range of about $10^6$. However, because it is a non-integrating detector, it can provide only an instantaneous reading of the intensity. This is a drawback in certain situations where both current and past information is required. That is, in general, a non-integrating detector forces the system to monitor all detectors simultaneously. Therefore, the multiplexing provided by a CCD becomes impossible. The ability to record past information accurately allows for considerable simplication of the system. In many cases the system could not be realized without such simplification.

In an application such as measurement or detection of frequency hop signals, it is frequently necessary to know what happened in the previous millisecond or ten milliseconds. However, a non-integrating photo-detector does not permit this type of operation.

SUMMARY OF THE INVENTION

The photo-detector array consists of a plurality of charge-integrating photo-elements. Each photo-element is constructed so that the potential thereacross changes in proportion to the charge accumulated therein. The simplest such photo-element is the reverse biased PN junction. Associated with each photo-element is a strobed comparator, a discharge switch, and a digital counter the outputs of which are selectively enabled onto a bus and cleared. The comparator is periodically enabled by a strobe signal common to all comparators in the array. If sufficient charge has accumulated on an element such that its potential exceeds a specified threshold when the comparator is strobed, the reset switch is activated, thereby discharging the element. At the same time, the counter is advanced. If less than the required amount of charge has been accumulated, the element is allowed to continue integrating and the counter is not advanced despite the strobing of the comparator. The counters are succesively enabled onto the bus, the outputs of the counters are sensed, digitally recorded and then cleared. Certain counters operate to digitally accumulate exceedances (charge accumulations above a specified threshold) while other counters in the array are accessed. The intensity at each photo-element is, within wide limits, proportional to the number of exceedances per unit time. Equivalently, the intensity at a photo-element is proportional to the inverse of the time or the number of strobes occurring between exceedances.

DESCRIPTION OF PREFERRED EMBODIMENTS

Figure 1:
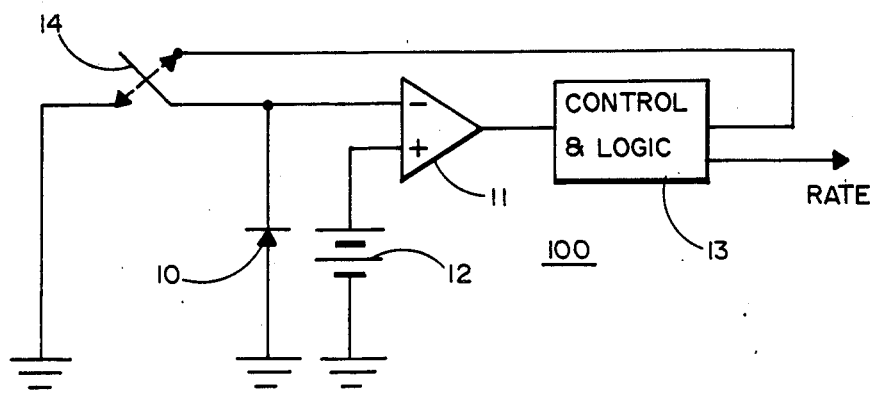
FIG. 1 is a schematic diagram of a basic circuit cell of the instant invention.

Referring now to FIG. 1, there is shown a single detector circuit 100 from which an array can be built. This circuit includes a detector element 10 which is represented here as a PN junction (or diode) which is similar to the element used in the CCD detector. The potential across diode 10 is sensed by a comparator 11 and compared to a reference potential which is indicated in FIG. 1 as a battery 12. The reference potential is set so that when the diode reaches a charge level at or near its saturation level, the comparator output signal changes state. In response to the comparator changing state, control logic 13 activates switch 14 momentarily to discharge the charge collecting element, i.e. diode 10. That is, in an operating cycle the detector 10 accumulates photo-generated charge which is compared to a reference potential and the control logic opens (or closes) a switch when a particular level is reached. In this case, switch 14 closes momentarily so as to discharge the diode and remove the photo-generated charge. The switch then opens and the process repeats. Of course, switch 14 can be formed as a part of the logic circuit 13.

The rate at which this process is repeated is proportional to the rate of charge accumulation rate on the diode 10. The charge accumulation is, in turn, proportional to the intensity of the applied light beam (i.e. photo source).

In a CCD detector array, the diode does not integrate up to its saturation level or any where near it. In fact, in CCD applications, saturating the diodes for any appreciable length of time produces an inaccuracy in the measurement. Therefore, in a CCD detector, whatever charge has accumulated on the diode is periodically dumped out to the CCD analog shift register and sensed. This is a severe drawback in that during each switching process of loading charge from the diodes into the CCD array, noise is introduced into the measurement. Thus, with a small amount of charge in the diode, the noise charge is an appreciable fraction of the real signal charge whereupon the signal-to-noise ratio is very low for small intensities.

One important advantage in the architecture of the instant invention is that when the diode is filled (or nearly filled) with charge, the level of charge is very large compared to the noise associated with the switching (or dumping) process. Conversely, the charge uncertainty introduced during the dumping process in the instant circuit is extremely small relative to the total amount of charge that is being sensed.

Thus, a high dynamic range in a photo-detector array is achieved by sensing the ouputs of photo-diodes individually, and subsequently resetting these photo-diodes only when the accumulated charge has exceeded some prescribed threshold. The average intensity on any given diode is proportioned to the rate at which that diode exceeds the threshold and is reset. This concept is most simply illustrated when applied to a single photodiode.

In FIG. 1, the switch 14 is first closed and the charge on diode 10 is thereby removed. Then the switch 14 is opened, and photon-liberated electrons accumulate in the P region of the diode. This lowers the potential at that node. The accumulation process continues until the comparison threshold is exceeded, whereupon the control logic 13 closes the switch 14 again, draining the diode 10 of its accumulated charge. The switch 14 is then opened again, and the cycle repeats. However, it is known that the intensity at the diode 10 is proportional to the time rate of reset occurrences.

Figure 2:
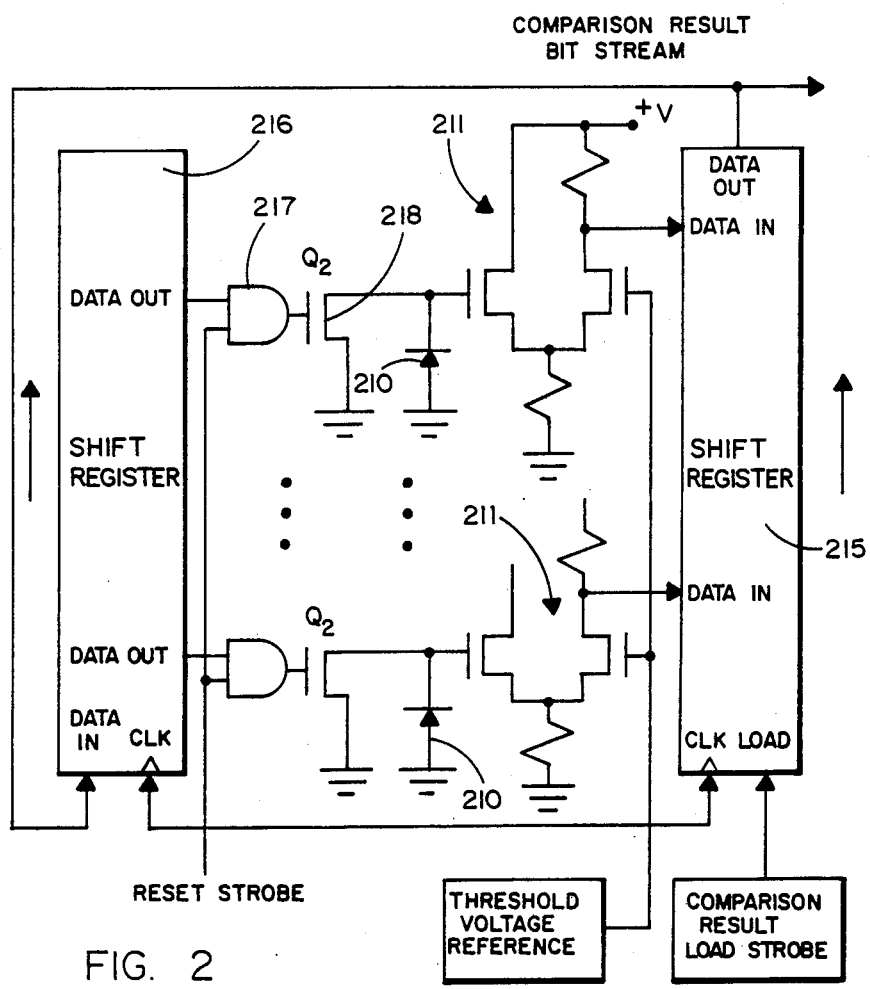
FIG. 2 is a schematic diagram of a detector array in accordance with the instant invention.

Referring now to FIG. 2, there is shown one implementation of an array of the detector circuits 100 described above. In FIG. 2, a plurality of diodes 210 is connected to individual comparators 211, respectively. In this embodiment, the comparators 211 are implemented as differential pairs comprised of MOS transistors. In particular, the differential pairs continually compare the diode potentials to the threshold reference. The comparison results are periodically loaded broadside (parallel) into shift register 215 at the DATA IN terminals, then sequentially clocked out at the DATA OUT terminal to form a bit stream. This bit stream is clocked into the shift register 216 at the DATA IN terminal When all the comparison results are loaded into shift register 216, a reset strobe pulse is applied to the AND gates 217, which serve to selectively gate the reset strobe pulse to those transistors connected to diodes on which potentials have exceeded the threshold. The remaining diodes continue to integrate.

The bit stream at the output of shift register 215 is monitored, and the reset pulses applied to each diode during some measurement time interval are counted. To a first order, the dynamic range of the array is the number of cycles completed during the measurement time interval and is, therefore, arbitrarily large such that the measurement time interval may be lengthened. In an alternative arrangement, detector potentials may be multiplexed to a single comparator in order to minimize noise factors. This multiplexing can be accomplished by means of a CCD shift register or by means of a conventional analog multiplexer. In either case, high impedance buffers are desirable between the diodes and the multiplexer or CCD shift register, to prevent leakage of charge from the diodes. The drawbacks of multiplexing to a single comparator are comparator speed, and noise introduced in the circuitry and signal processing between the diodes and the comparator.

In this embodiment, a binary 1 stored in the register 215 represents that the threshold has been exceeded in the corresponding detector diode 210. Conversely, a binary 0 represents that the threshold has not been exceeded. This serial sequence is loaded into shift register 216 which supplies output signals, in parallel, to AND gates 217. The gates 217 are the controlling elements for transistors 218 which selectively dump the charge out of the diode elements 210. Thus, there is a transistor 218 for each array element 210.

However, this architecture implementation is rather slow. In fact, it may be no faster than the conventional CCD detector because of the requirement to read all of the comparison results from comparators 211, recycle these results from shift register 215 to shift register 216, and perform the logical AND function to determine which diodes need to be dumped. Consequently, this embodiment provides improved SNR but relatively little improvement in operational speed.

However, in the embodiment of FIG. 2, diodes are allowed to accumulate charge until the potentials thereat are much greater than noise levels in the comparator. A diode is never "read" when the charge stored thereon is very small, as must occur with conventional CCD detectors. In conventional CCD detectors, all diodes are simultaneously discharged into the CCD shift register and the charge is subsequently measured. Consequently, the noise level determines the smallest signal which may be accurately measured. In the instant arrangement, noise is suppressed by a factor of about $1/\sqrt{N}$, where N is the number of cycles during the measurement time interval.

Figure 3:
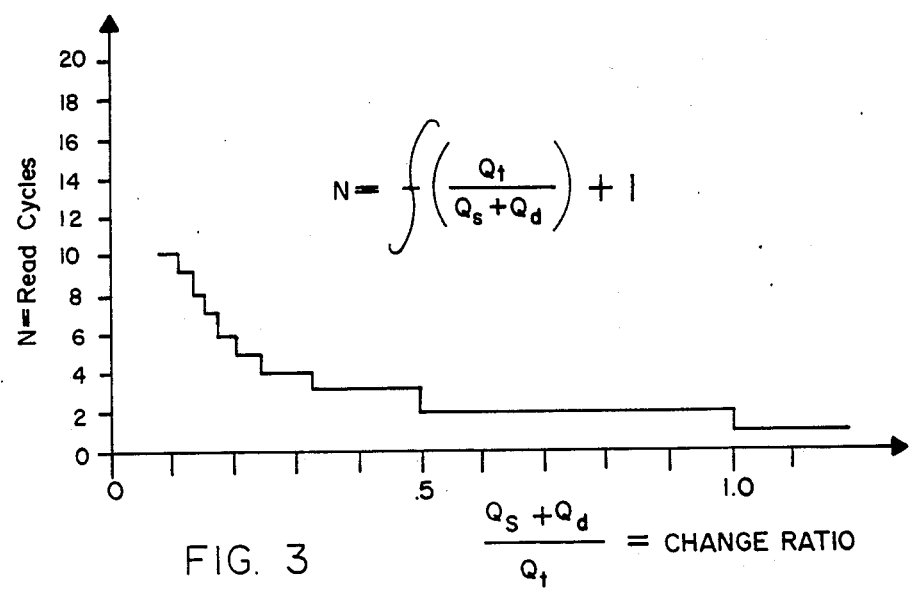
FIG. 3 is a graphic representation of the operation of the instant invention as related to the number of comparisons made between exceedances.

FIG. 3 is a graphical representation of mathematical calculations which show the number of read cycles between threshold crossings as a function of the actual signal plus the dark charge relative to threshold charge. The graph is based upon the mathematical expression $N = \int (Q_t/Q_s + Q_d) + 1$ where N is the number of times a given detector is read (i.e. sensed) between the time it exceeds the threshold and is dumped and the time it exceeds the threshold again; $Q_t$ = threshold charge; $Q_s$ = signal charge which accumulates in each detector between sense cycles due to incident light energy; and $Q_d$ = dark charge which accumulates in the detector between sense cycles.

Assume that the function of the system is to determine the intensity at each detector site. Then, the rate at which each detector exceeds the threshold and must be dumped is proportional to the intensity. Because the array is sensed periodically, as is each detector element, the exceedance rate will be discontinuous as shown in FIG. 3.

As the signal charge and the dark charge are smaller and smaller relative to the threshold charge, more and more sense cycles may be performed between crossings. That is, more time is required to fill the detector if the accumulation rate is low. This rate of threshold crossings is useful in measuring the intensity. The rate is proportional to 1/N.

Figure 4:
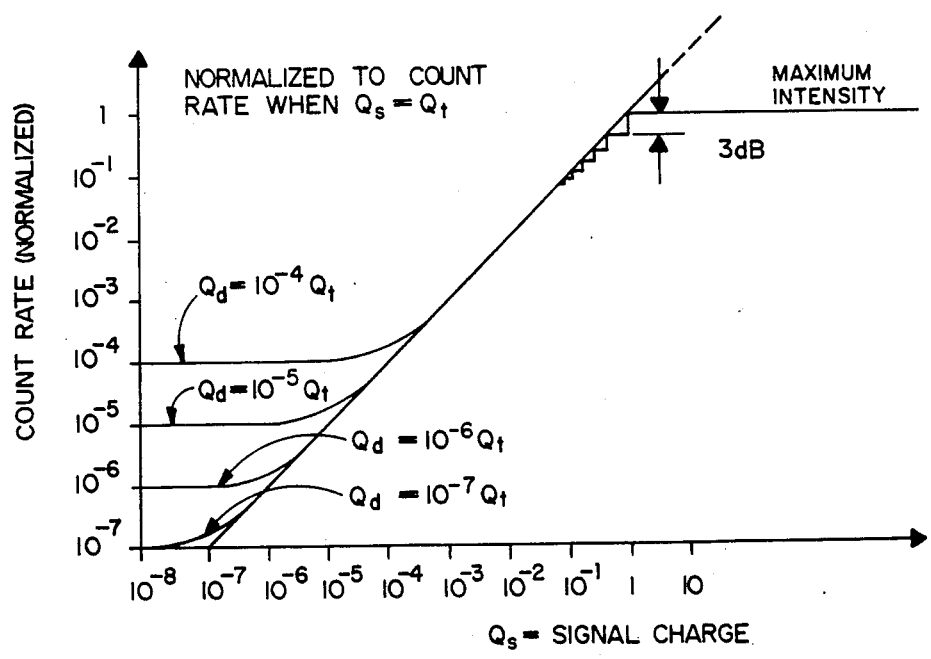
FIG. 4 is a graphic representation of the count rate as related to intensity for different dark current levels.

FIG. 4 is a graph of the count rate versus the light signal intensity, for various values of dark charge. Since N must take an integer value, the curves of FIG. 4 actually consist of irregular steps. The steps are large for large signal levels, but become vanishingly small for small signal levels. It will be seen from FIG. 4 that, if signals are limited in intensity to that level which produces a threshold crossing with every sense cycle, then the worst error is 2 dB. FIG. 4 also shows the relationship between the dark current in the diodes and the dynamic range of the device. The dynamic range is, roughly, the ratio of the threshold charge to the dark current integrated over one read/sense cycle. It suggests that cooling of the detector will improve high dynamic range performance because cooling reduces dark current.

There are two important sources of noise the effects of which should be considered. One is the noise associated with rejecting or dumping each detector element after the threshold has been crossed. The other is the noise associated with the FET differential amplifier/comparator circuit used to determine threshold crossing.

The effect of both of those noise contributions is greatly reduced because the variations in the apparent threshold introduced thereby are small compared to the threshold value. For estimation, assume that the threshold is 500 millivolts, and that this corresponds to a charge of $5 \times 10^5$ electrons. This gives an effective diode capacitance of 0.16 pF. The reset noise at 300° K. would be:

reset noise $Vrms \cong (KT/C)^{\frac{1}{2}} = 0.137$ mV

Assume that the comparator noise (rms) referred to the input is on the order of a millivolt, i.e. comparator $Vrms = 1$ mV.

Thus, the combined noise is on the order of a millivolt. This would introduce an uncertainty of about 2 parts in 1000 in the threshold which would be insignificant in many cases.

It can be seen that this device is limited in its performance almost exclusively by the dark current. Assuming a diode capacity of $1.5 \times 10^8$ electrons, and a dark current at 5 pAmp, (these figures are taken from existing literature), dark current will fill such a well in a time period calculated as:

$$i_j \Delta t = Q_{sat}$$

$$\Delta t = 1.5 \times 10^8 e - /(5 \times 10^{-12}) e - /1.6 \times 10^{-19} = 4.8 \text{ seconds}$$

Assuming that the array can be read out in 1 mSec, the ratio of the threshold charge (which is assumed to be equal to the saturation voltage) to the dark current accumulation during one read/sense cycle is $4.8 \times 10^6$ to 1. That is the dynamic range of the system at room temperature.

It is known that dark current halves for every 6 to 7 degree (Kelvin) temperature decrease. If the device is cooled from 25° C. to −50° C., the dark current will decrease by a factor of $(2)^{75/6}$ to $(2)^{75/7}$, or somewhere between 1000 and 5000.

As noted, FIG. 4 shows the count rate versus the intensity. In this graph, intensity is the independent variable $Q_s/Q_t$ where $Q_s$ is the signal charge or the charge due to photo generation and $Q_t$ is the threshold charge. Thus, $Q_t$ is the level of charge at which the threshold has been exceeded and a count occurs. The value of $Q_s/Q_t$ is proportional to the intensity and the rate is the dependent variable.

FIG. 4 also shows the performance of the detector and the dependence upon the thermal generation of charge within the diode elements. This can be an important consideration in this system architecture. It can be shown that the dynamic range, i.e. the largest signal which can be measured (shown at the upper right of the graph) compared to the smallest signal (lower left), is limited as a function of the dark current. In FIG. 4, "maximum intensity" corresponds to the charge accumulation rate which fills the detector in exactly the amount of time required to sample it. That is, if the detectors in the array fill up between the consecutive sampling times, maximum intensity is achieved.

However, the dark current also tends to fill up the detector elements. Therefore, the generation of dark current limits the smallest intensity that can be measured accurately. Otherwise, as shown by the graph, the circuit tends to approach the dark charge generation asymptotically. The dynamic range is the ratio of the maximum intensity to the asymptote which corresponds to the dark charge which prevails. It can be shown that this dynamic range can easily be $10^6$ or $10^7$.

FIGS. 3 and 4 describe the performance of the circuit. The independent variable $Q_s/Q_t$ is the ratio of the actual accumulated charge to the threshold charge. The dependent variable is the count, or its inverse, N, rate which is the ultimate output of the detector array of the particular detector element. In FIG. 4, the count rate, the dependent variable, is normalized to the count rate occuring when $Q_s=Q_t$. That situation corresponds to the detector element filling up exactly to the threshold each time the detector potential is sensed.

Figure 5:
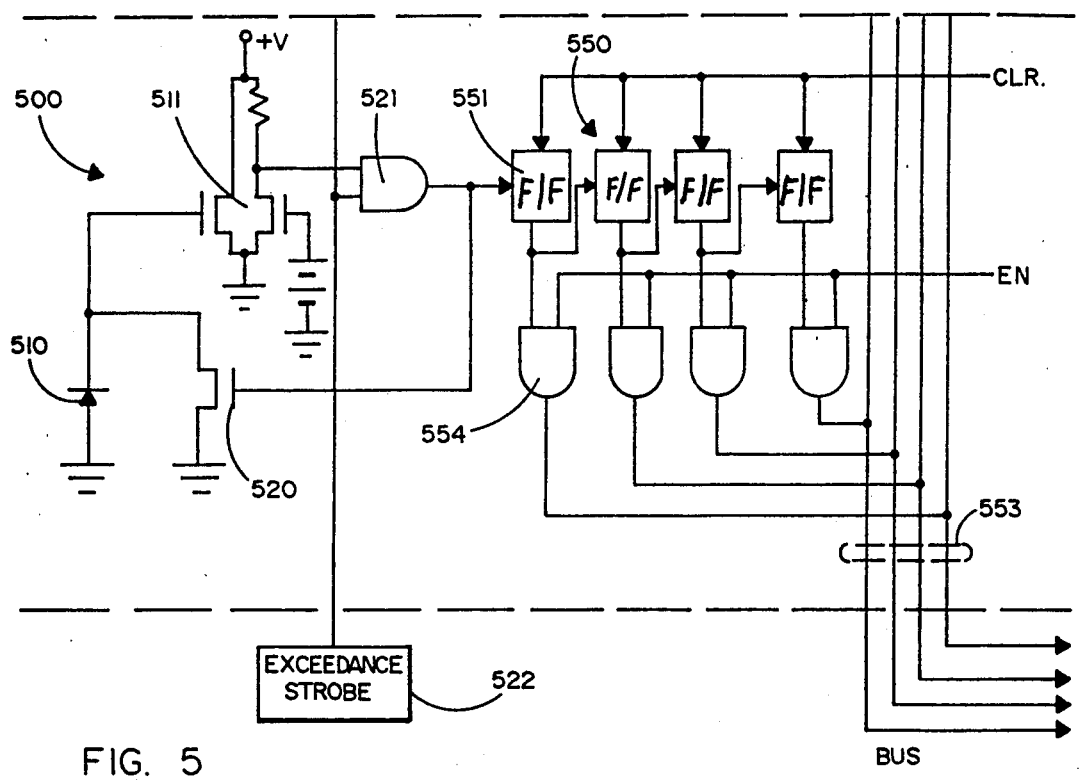
FIG. 5 is a schematic representation of another embodiment of the instant invention.

FIG. 5 is another embodiment of the detector array implementation. In this embodiment, a detector element 500 includes diode 510 and a detector reset path which is shown as an MOS transistor 520. The comparator is shown as a differential pair 511 comprised of MOS transistors. The output of the comparator 511 feeds one input of AND gate 521. The other input of gate 521 is supplied by the exceedance sensing strobe 522. This strobe source provides a pulse which is common to all the detector elements. For convenienience, FIG. 5 shows only the single detector element 500. However, it is to be understood that the strobe line runs the entire length of the array and is connected to each detector element.

The strobe source 522 provides a periodic sensing signal which permits the AND gates 521 to transfer the results of the comparison and, thus, to determine if "exceedance" has occurred. If exceedance in the diode has occurred, i.e., if the charge accumulated on the diode has reached the threshold level, the comparator output is a logical "1". When the strobe is applied, it presents the logical "1" to AND gate 521. This logical "1" causes gate 521 to turn on the detector reset transistor 520. In addition, this signal is supplied to the binary counter 550. The binary counter 550 is indicated as a series of toggle flip-flops 551 which are connected in cascade. Thus, each time the threshold is exceeded the counter 550 is advanced by one. Conversely, if the threshold has not been exceeded, the counter is not advanced.

Assume that the circuit operation started with the counter cleared to zero. After the detector has operated for a length of time, the output of the counter 550 is read at the outputs of AND gates 554. The digital (binary) number at the outputs of gates 554 represents the number of exceedances which occurred and have been counted during that period of time. This number represents the intensity of the detector element. Of course, any numbering code can be utilized in this system.

As shown in FIG. 5, the outputs of the counter 550 are supplied via gates 554 onto the bus 553 which is shared by all of the elements. However, only one counter at a time is gated onto the bus and the bus logic values indicate the output of that counter. Thus, the process of reading the entire detector array consists of selectively enabling counter 550 onto the bus 553, sensing the outputs which are brought to the outside of the chip, recording that data, and clearing the counter 550 so that it is ready to accumulate signals during the next cycle. That is, the counter will "free run" until the outputs of each counter are placed, one at a time, on the bus 553. This transfer to the bus occurs when the signals at the counter are gated through gates 554 by the enable signal. After the enable signal EN is applied, a clear signal CLR is supplied which clears the counter. Th same operation is conducted for the next segment or element in the array and so forth. This architecture has improved SNR, as well as improved speed operation.

Very concisely, in the operation of the circuit of FIG. 5, the exceedance strobe line is driven with a continuous pulse train. When the voltage level of a diode exceeds threshold, the next exceedance strobe pulse produces a pulse at the output of the AND gate, discharging the diode, and advancing the counter by one. At some time, the enable line EN is asserted, thereby gating the counter outputs onto the bus. Alternatively, it may be desirable to disable the counters during this time. After data have been read from the bus by external circuitry, the counters are cleared by assertng the CLR line. The counters of the next detector are read next, and so on, until the entire array is read out. The array read out is then repeated.

In an alternative embodiment, it is possible to eliminate the external strobe. In this alternative arrangement, a circuit (such as one-shot circuit or the like) which operates essentially independently will be immediately activated when an exceedance has occurred. However, a common strobe to all the detectors appears to be more desirable because it provides more control over the operation of the detectors in each counting system.

In another embodiment, digital counters are provided at each photo-detector site. These counters are be clocked by a common clock line and the outputs thereof enabled, counter by counter, onto a common bus, and then cleared. This arrangement shown in FIG. 5 would speed up the rate at which threshold exceedances could be counted.

In analyzing the operation of the circuit of FIG. 5, let:

$t_r$ = counter readout time
b = bits per counter
$t_{sat}$ = time in which dark current will produce a threshold exceedance
N = number of elements in the array
$t_d$ = diode exceedance detection rate
$Nt_r$ = time required to read out all counters
$Nt_r/t_d$ = number of possible exceedance counts during read out of the array
$2^b - 1 = Nt_r/t_d$ = establishes number of bits needed in counter
$b = \log_2(Nt_r/t_d + 1)$ = number of bits in counters.

Assume that the counters can be switched onto the bus, read, and cleared at a 1 MH$_Z$ rate, and that the threshold exceedances are being sampled at a 1 MH$_Z$ rate. Then, in accordance with the equation $b = \log_2(N+1)$ representative values of b for given values of N are as follows:

| N = 1000 | b = 10 |
|---|---|
| N = 2000 | b = 11 |
| N = 500 | b = 9 |

If the dark current is small enough that $t_{sat} \geq 1$ sec, a dynamic range of $10^6$ is obtained with the detector. More specifically, $D.R. = t_{sat}/t_d$. Therefore, the lower the dark current, and the faster the exceedance detection rate, the higher the dynamic range. This embodiment allows an intensity measurement in about 1 second over a dynamic range of $10^6$.

Figure 6:
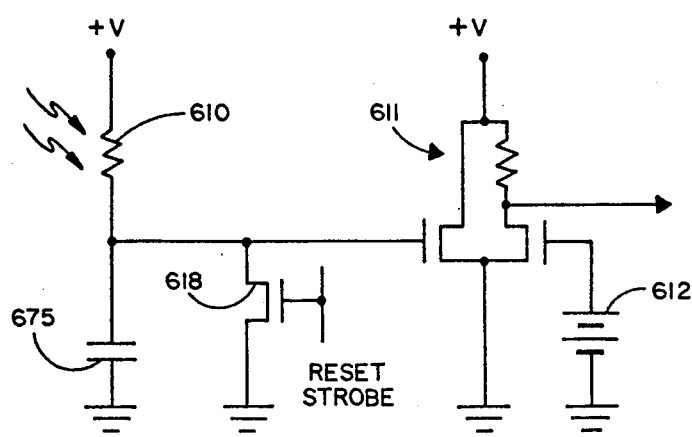
FIG. 6 is a schematic diagram of another embodiment of the instant invention.

Referring now to FIG. 6, there is shown another embodiment of the instant invention. In this embodiment the photon-to-charge conversion element comprises an avalanche photo-detector 610 for charging a capacitor 675. This arrangement permits some gain in the system. Also, device 610 can be a photo-conductor or photo-sensitive resistor which operates to charge the capacitor. There are a wide variety of photon-to-charge conversion elements which can be used. However, charge integrating elements must be used with these devices. The remainder of this circuit is similar to the circuit in embodiments previously described.

That is, in an avalanche photo-detector a photon strikes the semiconductor to produce free electrons which are accelerated by the field and which literally knock loose many other electrons. Thus, one photon may ultimately be responsible for the liberation of tens of thousands of electrons which become carriers. Thus, there is produced the noted gain effect, relative to a photo-diode or a PN junction where one photon generates or liberates only one electron hole pair.

The photo-diode or PN junction may be the simplest fabrication technique. On the other hand, if magnification or amplification of photons or charge is required the alternative approaches may be useful.

Another advantage of the instant exceedance counter architecture, is that the conventional CCD detector is, typically, required to be cooled to temperatures on the order of liquid nitrogen. In the instant exceedance counting detector architecture, the measurements over a wide dynamic range can be made in very short time spans and, also, the detector can be held at room temperature.

It may be advantageous to replace the photo-conductive element with an active light sensitive charging circuit. This would allow large capacitance values which reduce reset noise voltages, while at the same time allowing rapid charging of the capacitor due to active gain. Also, a different type of photo-detector may be more compatible with processing required for the comparator and counters and other on-chip logic.

A further advantage of a photo-conductor/active sensor and capacitor scheme may result from the fact that the capacitor could be referenced to ground. In typical PN photo-diode sensors, the junction must be reverse biased whereby, in some cases, the comparator would need to be biased to some level to compensate for the reverse bias voltage on the diode.

Thus, there is shown and described a threshold exceedance detector which operates quite rapidly over a wide dynamic range. Relative to a CCD detector, this circuit will perform at least equivalently and, perhaps, ten times faster. That is, if the conventional CCD photodector array has a 1,000:1 dynamic range for a 10 MS integration (a processing) time, the instant detector array will as well. However, at longer integration times, >50 MS, the dynamic range of the conventional CCD array becomes limited by thermally generated noise whereas the instant detector array is not. This results in an increase in the dynamic range measurement capability of the instant detector. Likewise, the exceedance counting detector could make a measurement having dynamic range of between $10^6$ and $10^7$ in about one second, as opposed to an hour or two for a conventional CCD detector array or as opposed to maybe a few tens of milliseconds for the wide dynamic range logarithmic detector.

Thus, there has been shown and described a preferred embodiment of the invention. It is clear that modifications can be made to the embodiments shown and described. For example, the type of photo-detector can be altered as described. Other modification of this type or in the specific configuration of the circuit may be apparent to those skilled in the art. However, any such modifications which fall within the purview of this description are intended to be included therein as well. This description is not intended to be limitative of the invention but, rather, is intended to be illustrative only. The scope of the invention is limited only by the claims appended hereto.

What is claimed is:
1. A charge accumulating measuring system comprising
   a plurality of charge accumulating means the output of which are coupled in parallel,
   a like plurality of threshold detecting means each coupled to the output of a respective one of said charge accumulating means and constructed to provide a logic level signal representative thereof, wherein each of said logic level signals is at a first logic level when a predetermined amount of charge has not been accumulated by its associated charge accumulating means and is at a second logic level when said predetermined amount of charge has been accumulated by its associated charge accumulating means,
   a like plurality of discharge means each coupled to a respective one of said charge accumulating means for selectively discharging the charge accumulated by said charge accumulating means,
   output storage means coupled to the output of each of said threshold detecting means for periodically sampling the states of all of said charge accumulating means and for storing all of said logic level signals that are present during said sampling,
   discharge drive means coupled to said storage means and to all of said discharge means for receiving the information stored in said storage means subsequent to its storage therein, said discharge drive means being constructed to periodically selectively discharge only those ones of said charge accumulating means which had accumulated a charge in excess of its associated threshold at the time said charge accumulating means were sampled.

2. A charge accumulating measuring system as claimed in claim 1 wherein said plurality of charge accumulating means comprises a plurality of sensing means each responsive to the receipt of photons thereby.

3. A charge accumulating measuring system as claimed in claim 2 wherein said sensing means each comprise a photo diode means.

4. A charge accumulating system as claimed in claim 3 wherein said output storage means comprises a shift register means which receives the output logic signals from said threshold detector means in parallel and which, after receipt thereof, stores said logic signals and transmits said stored signals at periodic intervals out of said first shift register means in a serial manner, and said discharge drive means comprises a second shift register means which receives the said information from said first shift register means in a serial manner, and after said second shift register means has received said information couples at a predetermined time said stored information as discharge control signals to said plurality of discharge means in a parallel manner.

5. A charge accumulating measuring system as claimed in claim 1 wherein said output storage means comprises a plurality of binary counting means each coupled to the output of one of said threshold detecting means, and each of which is constructed to provide an encoded output representative of the threshold of its associated threshold detecting means.

6. A charge accumulating measuring system as claimed in claim 5 comprising a bus common to all of said binary counter means, and control means for selectively gating the outputs of each of said binary counter means onto said bus during individual time periods.

7. A charge accumulating measuring system as claimed in claim 6 wherein said plurality of charge accumulating means comprises a plurality of sensing means each responsive to the receipt of photons thereby.

8. A charge accumulating measuring system as claimed in claim 7 wherein said sensing means each comprise a photo diode means.

* * * * *